United States Patent [19]

Perry et al.

[11] Patent Number: 5,342,801
[45] Date of Patent: Aug. 30, 1994

[54] CONTROLLABLE ISOTROPIC PLASMA ETCHING TECHNIQUE FOR THE SUPPRESSION OF STRINGERS IN MEMORY CELLS

[75] Inventors: Jeffrey R. Perry, Sunnyvale; S. M. Reza Sadjadi; Kristen A. Luttinger, both of San Jose, all of Calif.

[73] Assignee: National Semiconductor Corporation, Santa Clara, Calif.

[21] Appl. No.: 28,026

[22] Filed: Mar. 8, 1993

[51] Int. Cl.$^5$ ............................................ H01L 21/70
[52] U.S. Cl. ........................................ 437/52; 437/43; 437/48; 437/233; 156/643
[58] Field of Search ................... 437/43, 48, 233, 52; 156/643

[56] References Cited

U.S. PATENT DOCUMENTS

| 4,490,209 | 12/1984 | Hartman | 156/643 |
| 4,799,991 | 1/1989 | Dockrey | 156/659.1 |
| 4,808,259 | 2/1989 | Jillie et al. | 437/238 |
| 5,149,665 | 9/1992 | Lee | 437/43 |
| 5,158,902 | 10/1992 | Hamada | 437/43 |
| 5,242,536 | 9/1993 | Schoemborn | 156/643 |

*Primary Examiner*—Tom Thomas
*Attorney, Agent, or Firm*—Hickman & Beyer

[57] ABSTRACT

In the manufacture of memory cells, horizontal etching is controlled in a manner which prevents the formation of stringers between adjacent cells without undercutting the sidewalls of a memory cell.

8 Claims, 9 Drawing Sheets

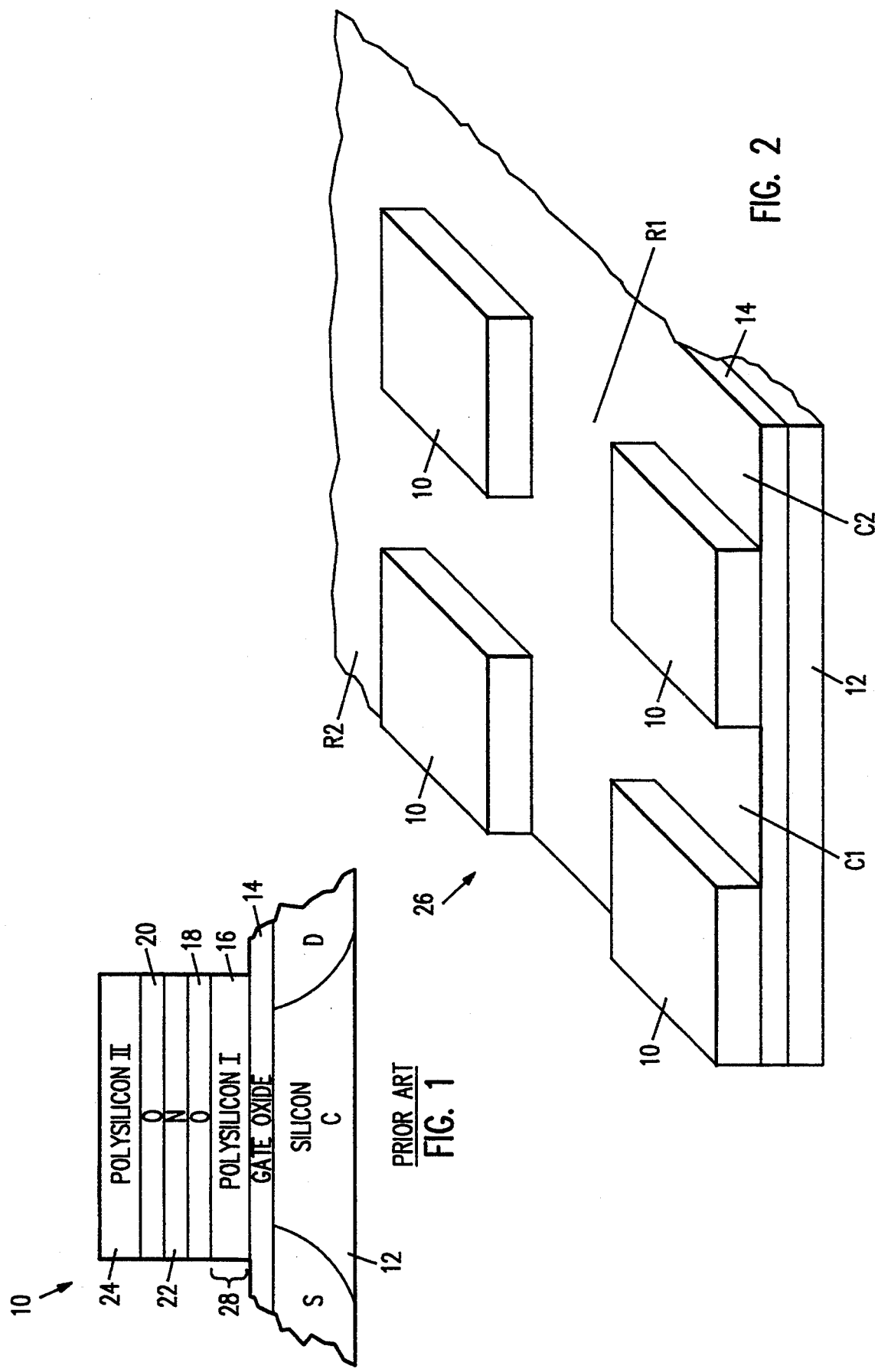

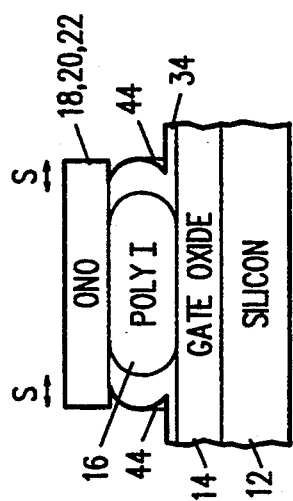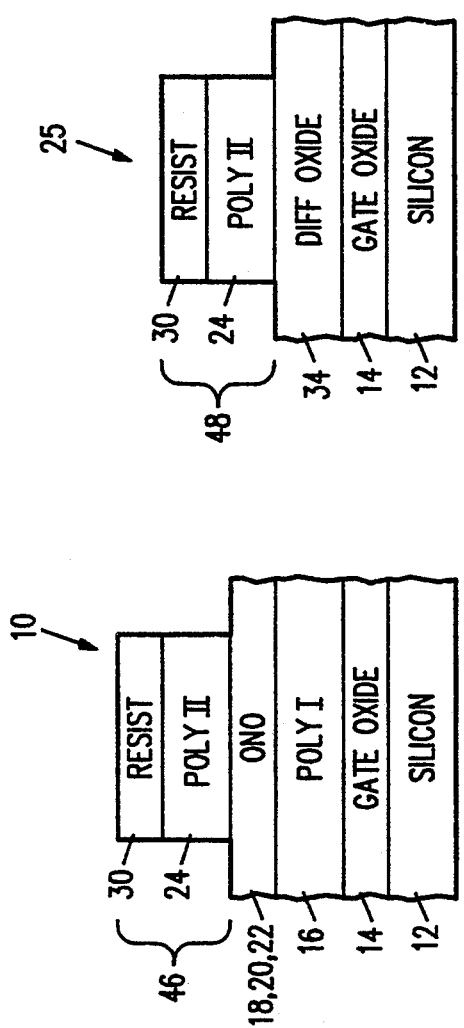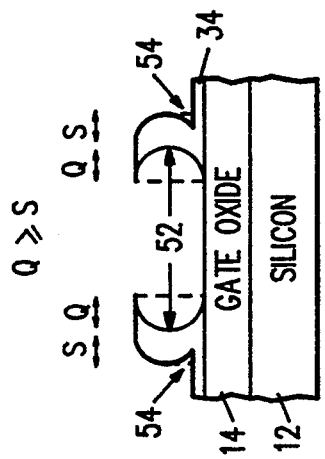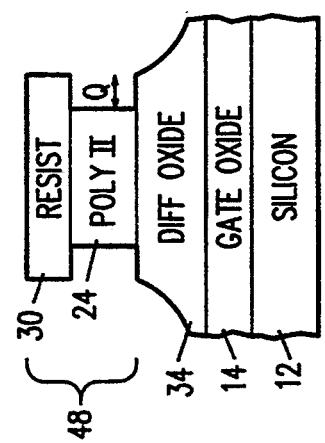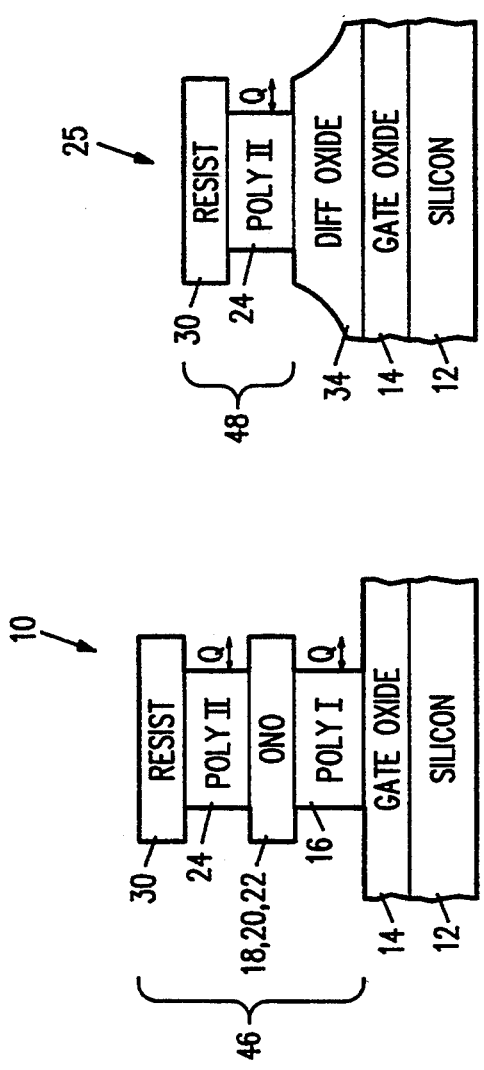

5,342,801

CONTROLLABLE ISOTROPIC PLASMA ETCHING TECHNIQUE FOR THE SUPPRESSION OF STRINGERS IN MEMORY CELLS

FIELD OF THE INVENTION

The present invention relates generally to memory cells such as EPROMs and their method of manufacture, and more particularly to a specific method of making memory cells in a manner which prevents the formation of stringers.

BACKGROUND OF THE INVENTION

EPROM and like memory devices or cells and various methods of manufacturing these devices are well known in the art. An example of one such prior art EPROM device is illustrated in FIG. 1 and generally designated by the reference numeral 10. As depicted in FIG. 1, this device includes a silicon substrate 12 having implanted therein a source S and a drain D on opposite sides of a channel C which, along with the source and drain, form a transistor region of the EPROM device. A gate oxide 14 coats the top surface of silicon substrate 12 and serves to support an array of different layers directly over the channel C, as illustrated in FIG. 1. This array of different layers includes a lower most or first film layer 16, such as a doped polycrystalline silicon (polysilicon or poly I) layer which serves as a floating gate. The terms first film layer and poly I will be used interchangeably hereinafter. A film layer in the manufacture of a memory cell is also any other suitable material, for example, doped amorphous silicon, may also be "polycide", for example tungsten silicide layer over doped polysilicon, and is not limited to polysilicon. On top of the poly I layer 16 are two additional oxide layers 18 and 20 with a nitride layer 22 therebetween (ONO layers), or an alternative can be any other dielectric layer such as tantalum part oxide, and finally an uppermost or second film layer 24 or other suitable material such as doped polycrystalline silicon (polysilicon or poly II) layer 24 which serves as a control gate. The terms second film layer and poly II will be used interchangeably hereinafter. The ONO layers serve to insulate the poly I and II layers from one another.

The EPROM device shown in FIG. 1 is but one of a relatively large number of such memory devices which together form an arrangement 26 of such devices sharing a common oxide coated silicon substrate, as illustrated in FIG. 2. As seen there, four such devices 10 are depicted on common oxide coated substrate 12. While not shown in FIG. 2, each of these devices is comprised of its own transistor region including a source, drain and channel and its own associated array of different layers including a poly I layer, a poly II layer and ONO layers therebetween. Also not shown in FIG. 2 are the standard electrical connections between the individual memory cell devices 10, which are referred to as second film layers 25 (see FIG. 4). Furthermore, for purposes of clarity, the various components making up the different memory devices are not illustrated in FIG. 2. It should be noted, however, that the various memory devices are arranged in rows 11 and columns 13 with row spaces R1, R2 and so on and column spaces C1, C2 and so on separating the individual memory devices from one another. Furthermore, the terms columns and rows can be used oppositely from the manner is which they are used in the description of the present invention, and that this invention is not dependent upon the terms and the labeling of rows and columns.

Having described the arrangement 26 of EPROM devices 10 from a structural standpoint, attention is now directed to one way in which the arrangement is produced in accordance with the prior art. To this end, attention is first directed to FIG. 3 which illustrates the overall arrangement of an EPROM device at an early stage in its formation. Specifically, the gate oxide layer 14 has been laid down on the top surface of a silicon or other type of semiconductor substrate 12. In addition, a first film layer 16 such as poly I and ONO layers 22 have been formed over the oxide coated substrate. FIG. 3 depicts that sections of the ONO and poly I layers have been etched away by conventional lithography to form a series of columns 13 of different layers separated by column spaces C1, C2 and so on, such between opposing sidewalls 28 of adjacent columns 13. Thus far, no row spaces R1, R2 and so on have been provided and, therefore, each columns 13 is continuous along its entire length.

Turning to FIG. 4, after column spaces C1, C2 and so on, have been formed and after source/drain regions associated with the various EPROM devices are established within the substrate, at least one thick layer of differential oxide 34 is grown wherever the first film layer is exposed, specifically along the first film layer segments of sidewalls 28 (see FIG. 1) and over the exposed gate oxide layer 14 within the column spaces. These differential oxide layers, which are generally indicated at 34 in FIG. 4 serve to physically and chemically protect the source and drain region during further processing of the overall arrangement of EPROM device and specifically during the formation of row spaces R1, R2 and so on.

After the formation of differential oxide layer 34, a second film layer 24 such as a polysilicon II layer is formed over the entire unit 26, that is, over the differential oxide layer 34 and over the ONO regions which were not covered by the differential oxide layer 34.

After the second film layer 24 is laid down, photoresist 30 is lithographically patterned in rows 11 of the unit 26, the rows 11, of course, parallel to the spaces defined by row spaces R1, R2, and so on. In other words, there is no resist remaining in the spaces defined by row spaces R1, R2, and so on. Accordingly, during the etching process, the goal is to remove the second film layer and the ONO and first film layer, where present, from the spaces defined by the row spaces R1, R2, and so on.

A serious drawback in the overall formation process described thus far resides in the formation of the relatively thick differential oxide 34. To illustrate the drawback, FIG. 5 shows a cross section denoted as X in FIG. 4 of the layers laid down in the region which will, after etching, provide the spaces defined by the row spaces, R1, R2, and so on. In particular, as illustrated in FIG. 5, because of its thickness and its failure to form adjacent to the ONO layers, 18, 20, 22, the differential oxide 34 has been found to penetrate significantly into the sidewalls 28 of the columns 13 at the tops of their respective first film layers 16, thereby forming what may be referred to as overhanging wedges 36. The significance of these overhanging wedges 36 will become apparent below.

Columns 13 are separated into individual EPROM devices 10, as illustrated in FIG. 2, which is representative of, but does not include, all elements of an operable EPROM with second film layer 25 (not shown in FIG. 2 but shown in FIG. 4) positioned across the ONO poly I island and in a continuous manner therebetween. Of particular interest is the way in which the first and second film layers, 16 and 24 respectively, as shown in FIG. 5, are removed from the areas which, after etching, are defined by row spaces R1, R2, and so on.

In the prior art, removal of both the first and second film layers 16 and 24 is done by means of vertical etching which is preferable in most processing applications. The differential oxide layer 34, which is electrically inert, is not entirely removed by plasma etching and therefore, its skeleton, as depicted in FIGS. 7 and 8, is left extending across row spaces, R1, R2 and so on as shown by cross-sectional area X of FIG. 6, after all etching has taken place. However, note specifically from FIG. 7 (which shows a cross-sectional view taken along cross-section X shown in FIG. 6) that, as a result of this vertical etching process, remnants 42 from the poly I material from first film layer 16 are formed on the inside of the portions of differential oxide 34 because they are located under the overhanging wedges 36 of differential oxide and are not entirely removed during the vertical etching process. Since the vertical etching process etches oxide slowly, the oxide "masks" the underlying poly I layer protecting it from etching. Furthermore, as a result of this vertical etching process, remnants 44 from the poly II material from second film layer 24 are formed in the outside portions of differential oxide 34 because they are not removed during the vertical etching process due to masking by the oxide. That is, there are remnants 42 and 44 of both the poly I and poly II, respectively, which are left in the inside and on the outside of the differential oxide 34 because they are not removed by vertical etching. These unremoved polysilicon remnants tend to form stringers across row spaces R1, R2 and so on between adjacent EPROM devices 10. These polysilicon stringers, which lie generally in the region indicated by cross-section X in FIG. 6, if left in place, will short the EPROM devices 10 together making the devices inoperative.

SUMMARY OF THE INVENTION

As will be described in more detail below, a method is provided in accordance with the present invention for producing EPROM devices (and memory cells generally) in a way which avoids the creation of polysilicon stringers. More specifically, the plasma etching process of the present invention, instead of providing only vertical or anisotropic etching, provides controlled isotropic etching. In other words, horizontal etching can take place simultaneously with vertical etching, however, at a controlled and therefore, slower rate. Therefore, the polysilicon stringers 42 and 44 shown in FIG. 7 are eliminated during the row space forming etching process because material removal occurs in the horizontal direction as well as the vertical direction. In the present invention, as will be seen, the sidewalls of each cell are undercut so that the polysilicon residue which forms stringers is eliminated.

BRIEF DESCRIPTION OF THE DRAWINGS

The present invention will be described in more detail hereinafter in conjunction with the drawings, wherein:

FIG. 1 is a diagrammatic illustration, shown in side elevation, of a memory cell, specifically an EPROM device, formed in accordance with the prior art;

FIG. 2 is a diagrammatic illustration, shown in partially broken-away perspective view, of an overall arrangement of EPROM devices;

FIGS. 9A-F depict the undercutting of the sidewalls in accordance with a first embodiment of the present invention;

DETAILED DESCRIPTION OF THE INVENTION

As discussed above and as shown in FIG. 4, after the columns 13 are formed, the differential oxide layer and the second polysilicon layer are formed. The row spaces are then formed. In the prior art, the rows 11 are formed by vertical etching, one method of which is to apply a combination of hydrogen bromide feed gas and chlorine feed gas, the flow rates having a ratio of less than or equal to 1:1. However, also as discussed above, vertical etching leads to the formation of undesirable polysilicon stringers 42 and 44 such as those depicted in FIG. 7.

Figure 3:
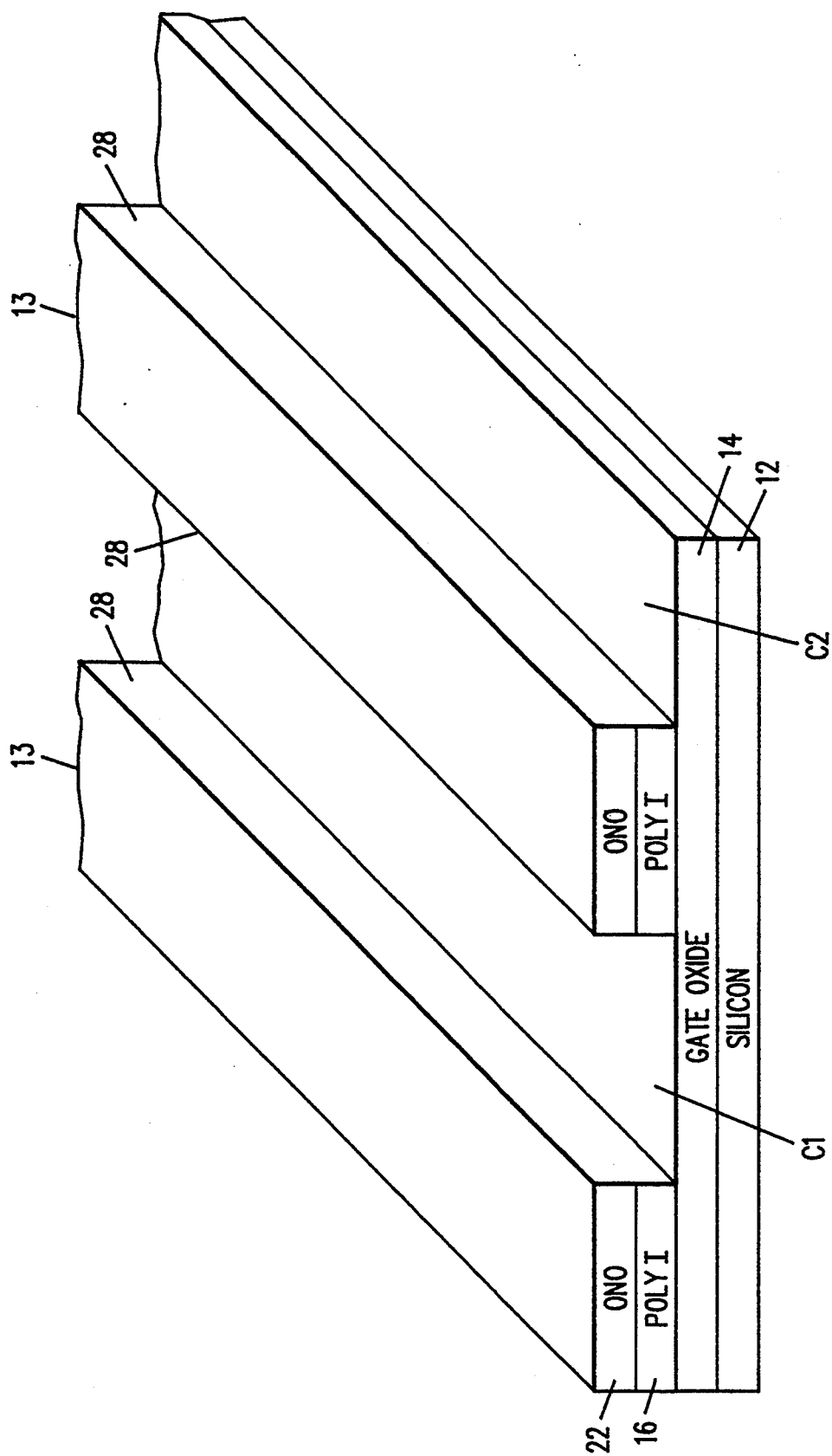
FIG. 3 depicts the overall arrangement of an EPROM device at an early stage in its formation.
Figure 4:
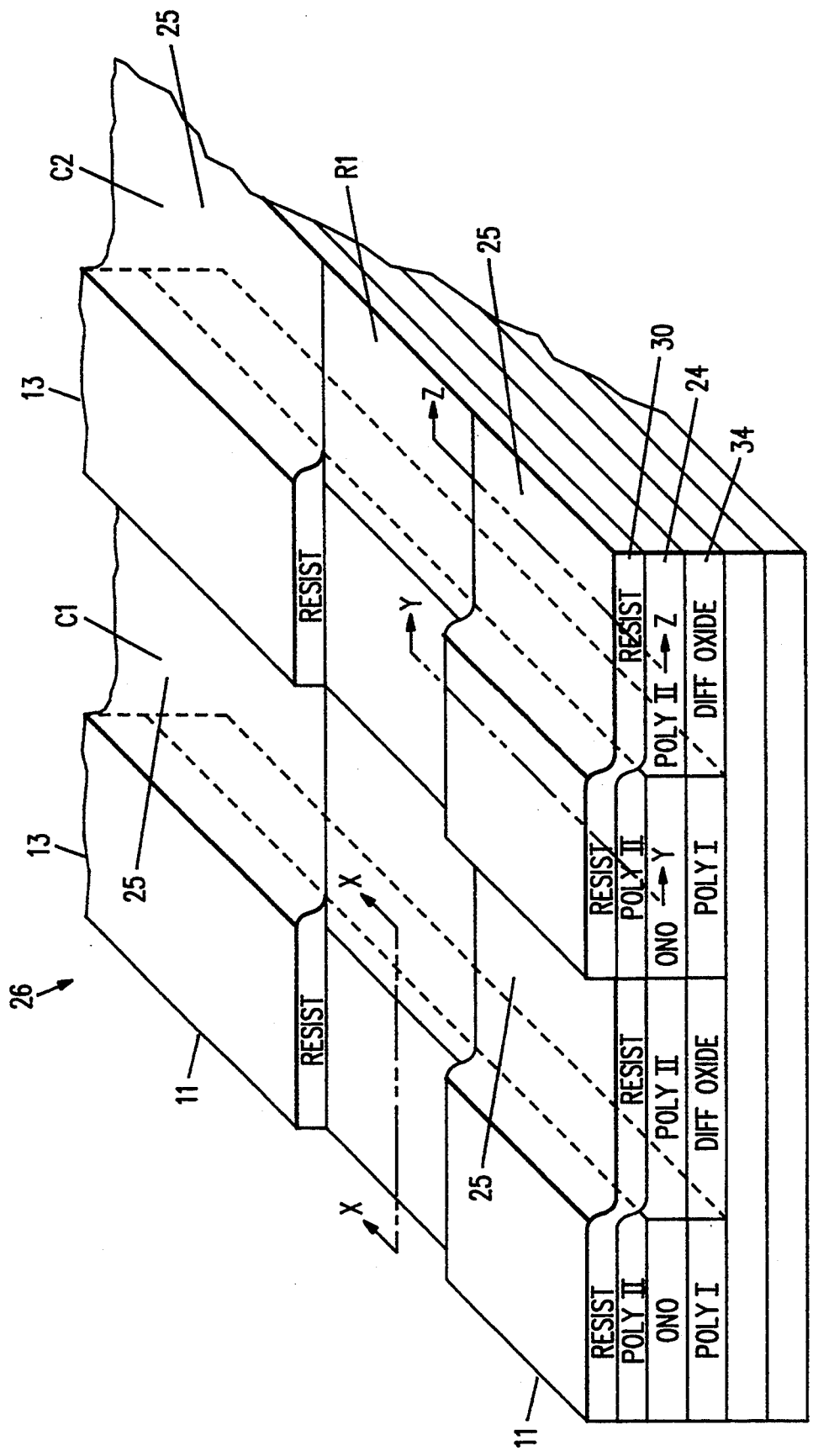
FIG. 4 depicts the overall arrangement of an EPROM device at an intermediate stage in its formation.
Figure 5:
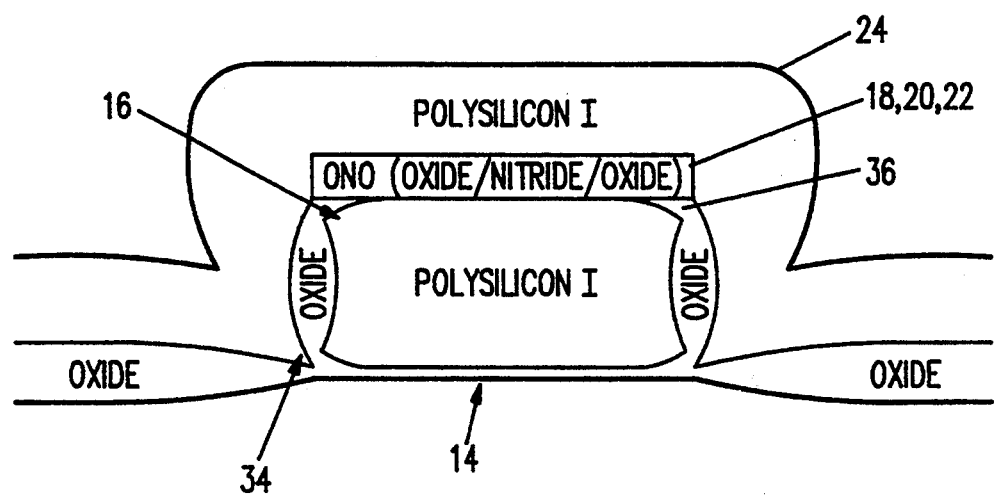
FIG. 5 shows a cross-sectional view X shown in FIG. 4.
Figure 6:
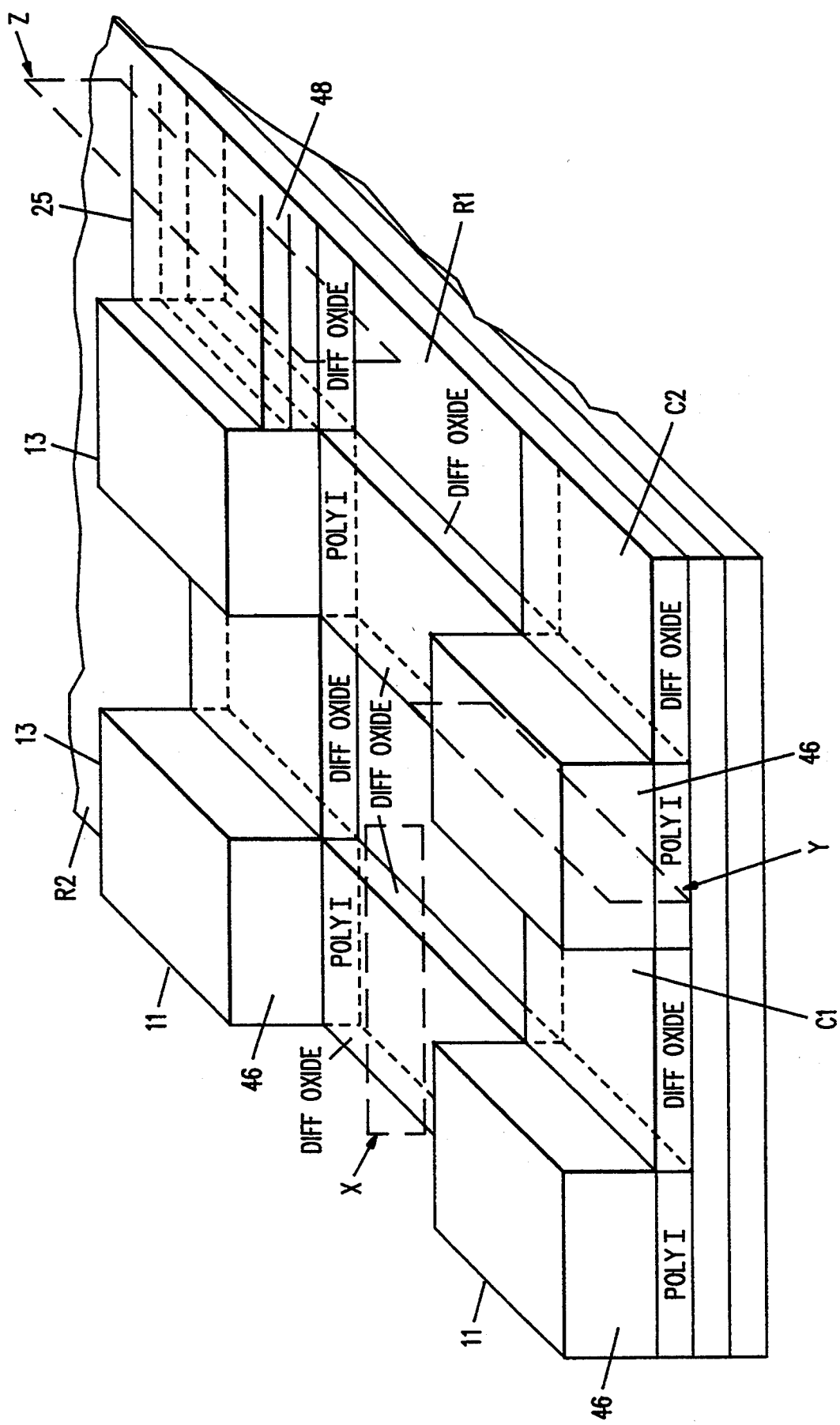
FIG. 6 depicts the overall arrangement of EPROM devices at a later stage in its formation.

In etching out row spaces, R1, R2 and so on to form the rows 11, sidewalls are developed on the individual devices 10 and the corresponding second film layers 25. To illustrate the location of the sidewalls, attention is directed to both FIG. 4 and FIG. 6. FIG. 4 shows the unit 26 after the column spaces have been formed. FIG. 6 shows that the location of the memory cells' sidewalls 46 are on either end of cross-section Y (also see FIGS. 9A, 9D, 10A and 10D which show the front view of cross-section Y according to different embodiments of the invention). Moreover, FIG. 6 shows that the location of the second film layers' 25 sidewalls 48 are on either end of cross-section Z (also see FIGS. 9B, 9E, 10B and 10D which show the front view of cross-section Z according to different embodiments of the invention). Notice that cross-sectional areas Y and Z which are perpendicular cross-sectional area X.

In most applications, an anisotropic etching plasma which provides vertical etching is preferable because it results in vertical sidewalls (see FIG. 1). However, the present invention instead utilizes a sidewall undercutting formula which does not provide for vertical sidewalls. The controlled isotropic etching plasma of the present invention provides for horizontal etching to occur simultaneously with the vertical etching, however, generally, to a lesser degree. By varying the etching conditions such as the hydrogen bromide feed gas flow to chlorine feed gas flow ratio, and/or temperature of the unit 26, and/or the amount of over etch used, the amount of horizontal etch with respect to the vertical etch may be controlled.

Figure 7:
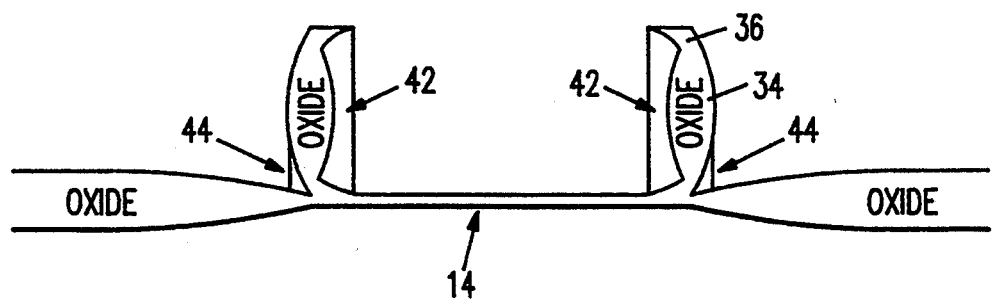
FIG. 7 shows a cross-sectional view taken along cross-section X shown in FIG. 6 without the benefit of the present invention.

By applying the etching plasma in accordance with the present invention so that it etches in a controlled isotropic manner, and therefore undercuts the sidewall of the cells, the remnants 42 of first film layer 16 are removed from under overhanging wedges 36 of differential oxide layer 34. Accordingly, the first type of undesirable stringers 42 which occur in cross-sectional area X of FIG. 6 and are shown in FIG. 7 are avoided.

Figure 8:
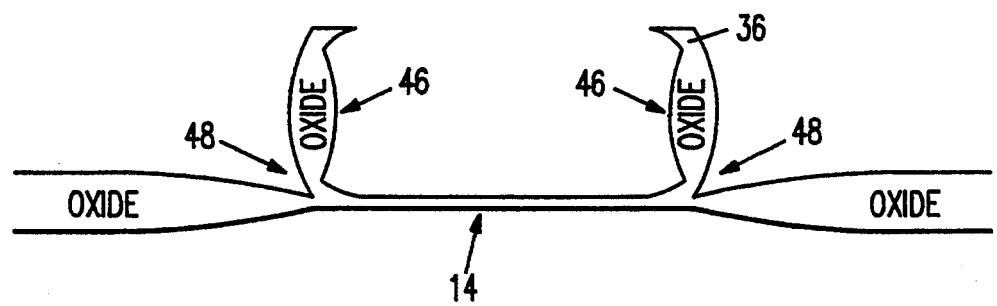
FIG. 8 shows a cross-sectional view taken along cross-section X shown in FIG. 6 in accordance with the present invention.

Likewise, by applying the etching plasma in accordance with the present invention, the remnants 44 of the second film layer 24 are removed from the outside of the differential oxide layer 34. Accordingly, the second type of undesirable stringers 44 which also occur in cross-sectional area X of FIG. 6 and are shown in FIG. 7 are avoided. FIG. 8 depicts the cross-sectional area of FIG. 6 wherein, in accordance with the present invention, there is an absence of polystringers 42 and 44, indicated by spaces 52 and 54 respectively.

In accordance with the present invention, an etching plasma which etches in a partially and controllable isotropic manner, such as that of hydrogen bromide gas to chlorine gas having a ratio of greater than 1:1, not only etches in a vertical direction, but etches in a horizontal direction so that stringers 42 and 44 are removed. As discussed above, the stringers would have otherwise been left behind were an anisotropic, vertical etching method used. As a result of the horizontal etching feature of the present invention, the sidewalls 46 of the cell 10 and sidewalls 48 of the second film layers 25 are undercut as the stringers 42 and 44 are removed. However, also in accordance with the present invention, the amount of undercut of the sidewalls 46 and 48 is kept to a minimum and therefore, does not impede the functioning of the memory cells.

The process of removing the layers in accordance with the present invention is typically performed in more than one step. Depending upon the circumstances, the second film layer 24 can be removed by an anisotropic, that is, a vertical etching plasma and then the first film layer 16 can be removed by a controlled isotropic etching plasma of the present invention. Or, in the alternative, the first and second film layers 16 and 24 can both be removed by a controlled isotropic etching plasma.

FIGS. 9A-F show the etching process first utilizing an anisotropic (vertical) etching plasma and then utilizing a controlled isotropic (horizontal and vertical) etching process. Both FIGS. 9A and 9B show the vertical etch of the second film layer 24, FIG. 9A showing device 10 and FIG. 9B showing second film layer 25. FIG. 9C shows that due to this anisotropic etching, remnants 44 of the second film layer 16 are left on the outside of the differential oxide layer 34. As indicated above, remnants 44 are undesirable stringers. FIG. 9C also shows that depth of remnants 44, indicated by distance S. Even though there is a potential for stringers to form because the vertical etching process leaves behind the remnants 44, these stringers are less likely to form as long as a controlled isotropic etching process occurs in the second etching step when the first film layer 16 is removed from the row spaces R1, R2 and so on.

FIGS. 9D-F show that when a controlled partial isotropic etching plasma which provides for horizontal and vertical etching is used, the sidewalls 46 and 48 are undercut while remnants 42 and 44 are avoided. The ONO layer is removed by an etching plasma containing gases such as C2F6, CF4 or CHF3 which does not significantly affect the first and second film layers. The remnant 42, (see FIG. 7) has a depth of Q and the remnant 44 has a depth of S (where $Q \geqq S$). While the size of 42 and 44 has been correlated to depth Q and S respectively, this correlation is used for illustration purposes with respect to FIGS. 9A-F and 10A-F and may, in tact, slightly deviate in proportion. By using the etching plasma of the present invention, the horizontal etching component controllably removes both the remnants 42 and 44 and therefore, the undercutting of the first film 16 and the second film 24 is also controllable. In accordance with the present invention, the amount of undercutting of sidewalls 46 and 48 can be controlled and therefore minimized to only penetrate a distance Q. Therefore, the integrity of the memory cell is not compromised by the avoidance of the stringer in the manufacturing process.

Also, in second film layer 25 shown in FIG. 9E, the second film layer 24 shows undercutting, minimized to penetrate only a distance Q within the cell sidewall 48. In FIG. 9F, note that the desired result of avoiding stringers is achieved, that is, that remnant 44 has been replaced by space 54, and the entire first film layer 16 has been removed from inside the differential oxide 34 skeleton, leaving spaces 52.

Figure 10A:
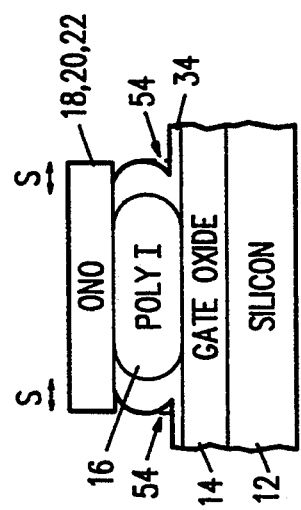
FIGS. 10A-F depict the undercutting of the sidewalls in accordance with another embodiment of the present invention.
Figure 10B:
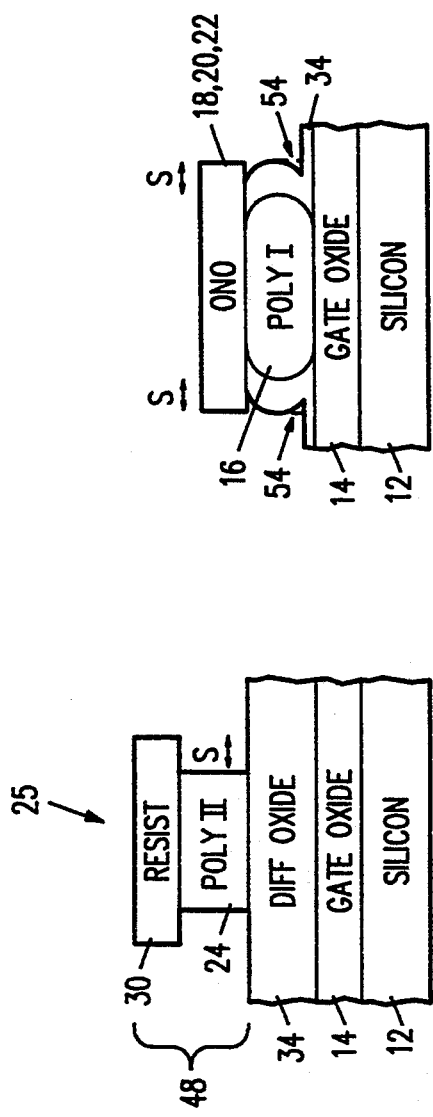
Figure 10C:
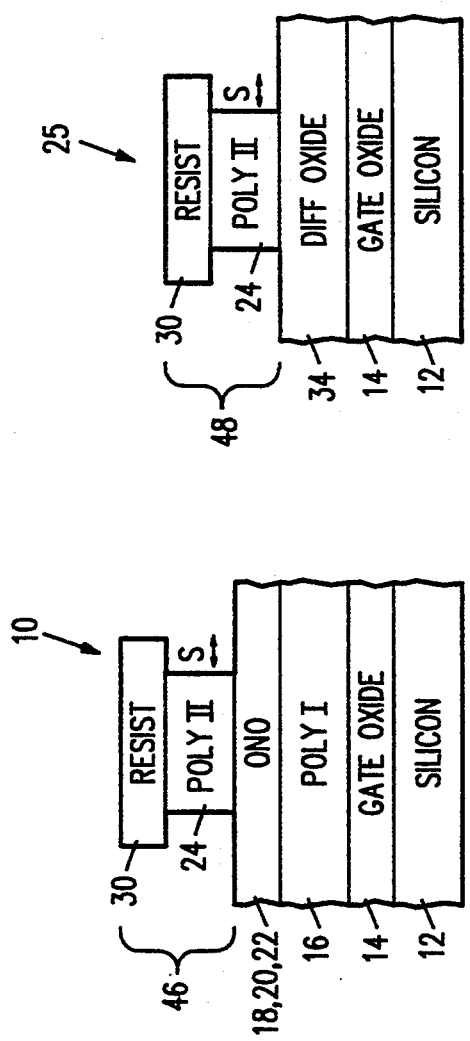

FIGS. 10A-F show the etching process utilizing a controlled isotropic etching process for both etching steps, thus removing both the first film layer 16 and second film layer 24 from the row spaces, R1, R2 and so on. As shown in FIGS. 10C, the controlled isotropic etching process removes remnant 44 which has a depth of S. FIGS. 10A and 10B show the undercutting penetrating a distance S into the second film layer 24 of side walls 46 and 48 of device 10 and second film layer 25, respectively. Thus spaces 54 are left on the outside of the differential oxide layer 34 and stringers are avoided.

Figure 10D:
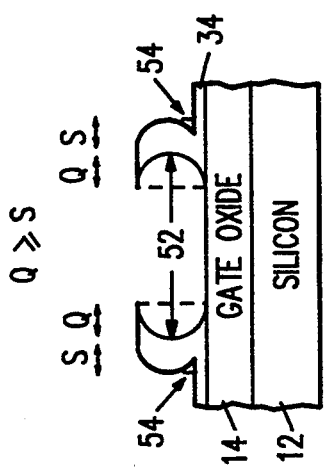
Figure 10E:
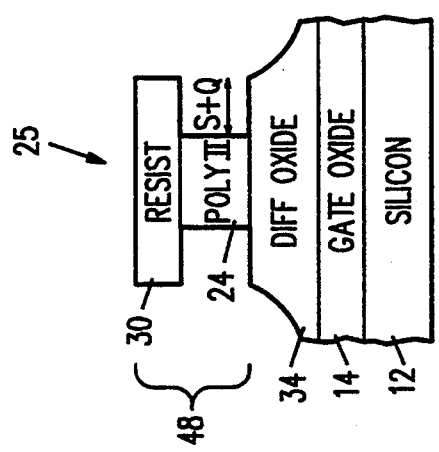
Figure 10F:
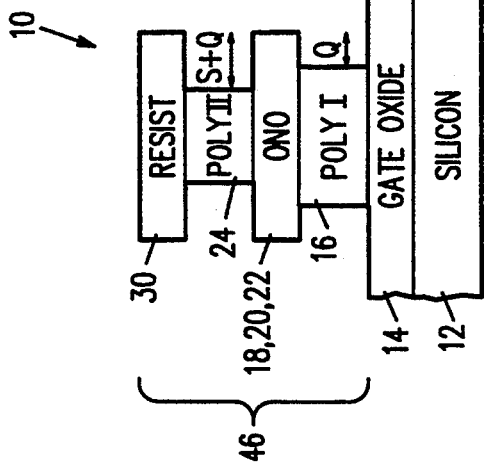

FIGS. 10D-F show that when the controlled isotropic etching plasma of the present invention is used in both the first and the second etching steps, the first and second film layers are undercut by different amounts because the second film layer 24 is twice subjected to the controlled isotropic etching plasma. The second film layer 24 is undercut by distance Q+S and the first film layer 16 is undercut by distance Q. By applying an etching plasma which provides for partial horizontal etching which occurs simultaneously with the vertical etching process, remnants 42 and 44 are avoided. The ONO layer is removed by an etching plasma containing gases such as C2F6 CF4 or CHF3 which does not significantly affect the first and second film layers. FIG. 1OF shows that the desired result of providing spaces 46 and 48 has been achieved, and hence stringers have been avoided.

If the final size of devices 10 and second film layers 25 can accommodate undercutting to the degree shown in FIGS. 10D and 10E, it is preferable to use the isotropic-isotropic etching process described in conjunction with FIGS. 10A-F instead of using the anisotropic-isotropic etching process described in conjunction with FIGS. 9A-9F because with the isotropic-isotropic etching process there is a better chance of completely avoiding stringers.

Conventionally, the etching plasma is formed in the etching chamber (not shown) by individually pumping hydrogen bromide gas and chlorine gas into the chamber and then applying RF power to the gas. By closely monitoring the etching process, that is, fine tuning the ratio of hydrogen bromide gas flow to chlorine gas flow and the temperature and over etch, the stringers 42 and 44 are removed or avoided, while not undercutting the sidewalls of devices 10 and second film layers 25 excessively.

As stated above, by varying the etching conditions such as the hydrogen bromide gas to chlorine gas ratio, and/or temperature of the unit 26 and amount of over etch used, the amount of horizontal etch with respect to the vertical etch may be controlled. FIGS. 11-14 illustrate how the controlled parameters have an effect on the amount of undercutting.

Figure 11:
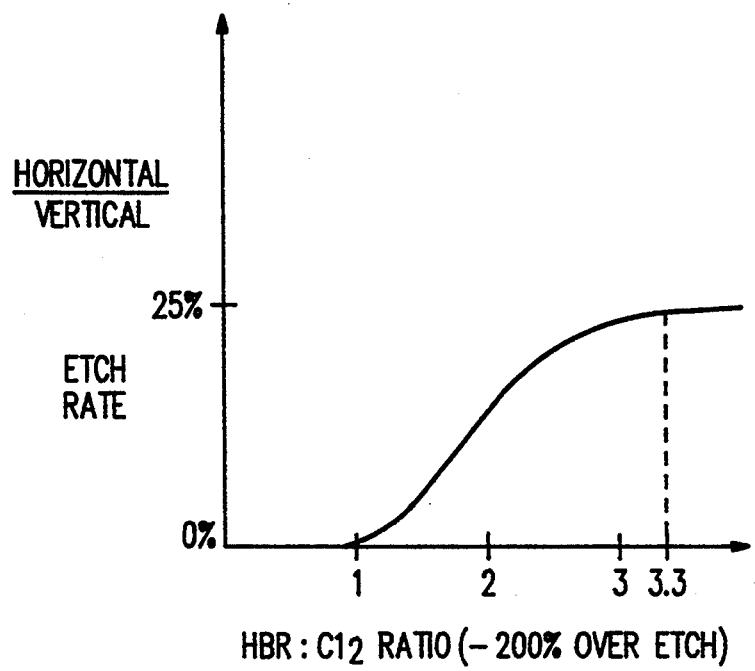
FIG. 11 is a graph showing the relationship between the percentage of horizontal etching to vertical etching as a function of the ratio of hydrogen bromide gas to chlorine gas.

Turning to FIG. 11, the graph of horizontal to vertical etching rate is shown to be a function of the hydrogen bromide to chlorine gas ratio. The graph shows that the horizontal etch rate increases as the ratio increases. At a ratio of 3.3:1, it has been found that the horizontal etch rate is 25% of that of the vertical etch rate. The graph of FIG. 11 further shows that the partially isotropic etch rate is effected by a ratio of hydrogen bromide to chlorine gas ratio of between 1:1 and approximately 3.3:1.

Figure 12:
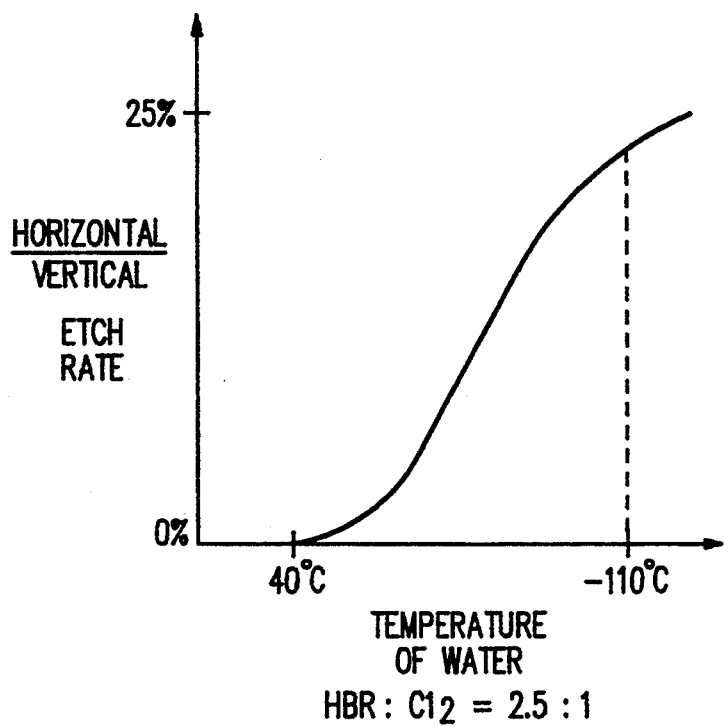
FIG. 12 is a graph showing the relationship between the percentage of horizontal etching to vertical etching as a function of temperature of the wafer.

Furthermore, according to FIG. 12, an increase in the temperature of the unit 26 also effects the horizontal etch rate with respect to the vertical etch rate. It has been found that maintaining a substrate temperature of 80°-110° C. further facilitates horizontal etching in the controlled partial isotropic etching process of the present invention. At 40° C. at a ratio of 2.5:1, typically, little or no horizontal etching occurs. But as the temperature is elevated, there is an increase in horizontal etching.

The temperature of the unit 26 can be controlled by conventional methods, such as positioning it within or on top of a temperature-controlled chuck. It will be apparent to those skilled in the art that there are other ways to control the temperature in the etching chamber.

Figure 13:
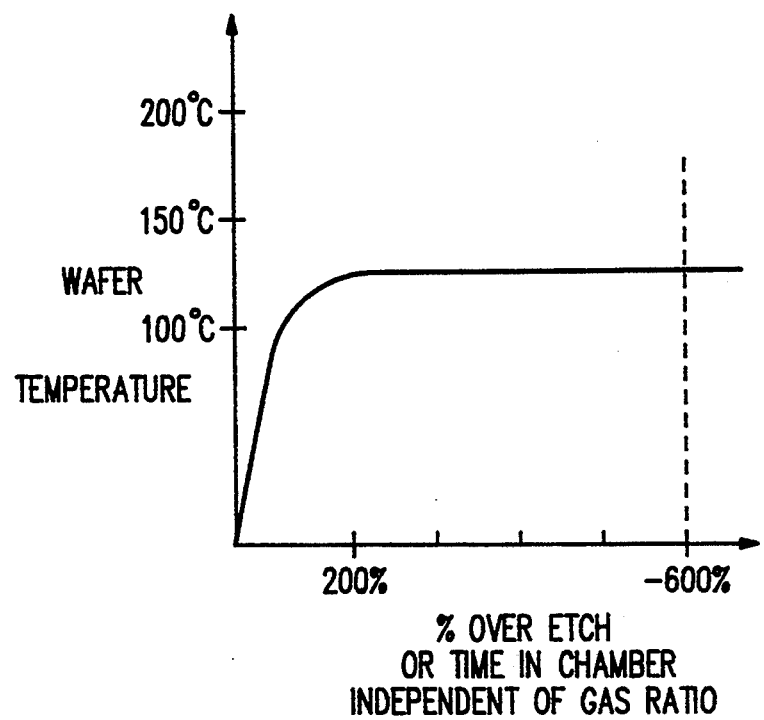
FIG. 13 is a graph showing the wafer temperature as a function of the percent over etch.
Figure 14:
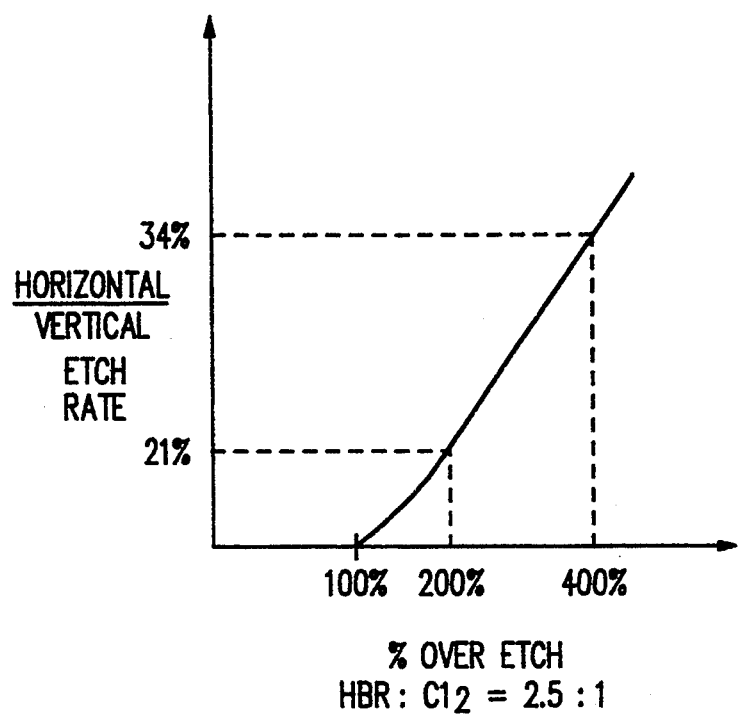
FIG. 14 is a graph showing the total horizontal etch as a function of percent over etch.

As FIG. 13 illustrates, the unit 26 temperature is a function of time it spends in the etching chamber, or as a function of its over etch. The horizontal axis of the graph of FIG. 13 is denoted by percentage of over etch or in the alternative, by the amount of time the unit 26 spends subjected to plasma etching gas in the chamber. In other words, the amount of time in the chamber and the percentage over etch can be used as interchangeable units. Accordingly, FIG. 13 shows that the more over etch occurs, the higher the temperature, or the more time the unit 26 would have spent in the chamber had the temperature been fixed and not varied. Therefore, the control of the temperature can be utilized in controlling the undercutting which occurs due to the partial isotropic characteristics of the gases having a ratio of greater than 1:1.

Horizontal etch rate to vertical etch rate is a function of percentage over etch. Finally, turning to FIG. 14, the graph shows such over etch is responsible for the undercutting of the side wall as shown in FIGS. 9A-F and 10A-F. At a fixed gas ratio of 2.5:1, when the over etch is low, there is a low horizontal etch. When there is a high percentage of over etch, there is a high horizontal etch.

FIGS. 11-14 show that by controlling different manufacturing parameters, the amount of horizontal etching is controllable. While the present invention has been described in conjunction with its use in manufacturing EPROM memory cells, the present invention is also useful for manufacturing EEPROM, PROM, DRAM, SRAM and other volatile and non-volatile memory. The present invention is also useful for manufacturing other semiconductor devices aside from memory devices. Moreover, as discussed above, other film layers besides polysilicon may be etched in accordance with the present invention, for example, doped amorphous silicon.

What is claimed is:

1. In the manufacture of a group of memory cells on an oxide coated top surface such that the cells are arranged in rows and columns with row and column spaces separating the individual cells from one another, each of said cells including an array of different layers on the oxide coated top surface including a first polysilicon film layer and a second polysilicon film layer, a method for preventing the formation of film stringers extending between adjacent cells in a given column during the cells' manufacture, said method comprising the steps of:

before forming said second polysilicon film layer, forming said columns;

after established said columns, forming said second polysilicon film layer and thereafter selectively etching said columns and between columns to form said rows and thereby form said cells, each of which having cell sidewalls including said first and second polysilicon film layers, wherein said selective etching of said column is performed by an etching plasma consisting essentially of a hydrogen bromide gas and chlorine gas combination having a ratio of greater than about 1:1 and includes etching away segments of said first and second polysilicon layers in a way which prevents the formation of said stringers.

2. A method as recited in claim 1 wherein said first film layer and said second film layer are both etched with said etching plasma.

3. A method according to claim 1 further comprising the step of achieving the temperature of said etching substrate between approximately 80° C. and 110° C.

4. A method according to claim 1 wherein said memory cells are EPROMs.

5. In the manufacture of a group of memory cells on an oxide coated top surface that the cells are arranged in rows and columns with row and column spaces separating the individual cells from one another, each of said cells including an array of different layers on the oxide coated top surface of said substrate including a first and a second polysilicon film layer, a method for preventing the formation of film stringers extending between adjacent cells in any given column during the cells' manufacture, said method comprising the steps of:

forming a first part of said array of different layers including said first polysilicon film layer on said oxide coated top surface;

forming said columns before said rows are formed;

after established said columns, forming a protective oxide layer and a second film polysilicon layer over said oxide coated top surface and said columns;

forming rows by selectively etching said columns and between said columns and thereby forming said cells, each of which having cell sidewalls including said first and second polysilicon film layers, wherein said selective etching of said column is performed by an etching plasma and includes etching away segments of said first and second polysilicon film layers in a way which prevents the formation of said stringers; and in applying said etching plasma, controlling the ratio of hydrogen bromide gas flow and chlorine gas flow so as to maintain a ratio of greater than 1:1.

6. A method as recited in claim 5 wherein said first film layer and second second film layer are both etched with said etching plasma.

7. A method according to claim 5 further comprising the step of varying said ratio of hydrogen bromide gas and chlorine gas while maintaining said ratio above 1:1.

8. A method according to claim 5 further comprising the step of maintaining the temperature of said etching plasma between approximately 80° C. and 110° C.

* * * * *